US009192070B2

(12) United States Patent
Tan et al.

(10) Patent No.: US 9,192,070 B2
(45) Date of Patent: Nov. 17, 2015

(54) SPRING LOADED LID

(75) Inventors: Chong S Tan, Spring, TX (US); Robert J Hastings, Spring, TX (US); Joseph R Allen, Tomball, TX (US); Michael T. Gill, Spring, TX (US); Kelly K Smith, Spring, TX (US); Keith A Sauer, Spring, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 293 days.

(21) Appl. No.: 13/984,168

(22) PCT Filed: Feb. 28, 2011

(86) PCT No.: PCT/US2011/026515
§ 371 (c)(1),
(2), (4) Date: Aug. 7, 2013

(87) PCT Pub. No.: WO2012/118478
PCT Pub. Date: Sep. 7, 2012

(65) Prior Publication Data
US 2013/0322037 A1 Dec. 5, 2013

(51) Int. Cl.
*H05K 7/10* (2006.01)
*H05K 7/18* (2006.01)
*H05K 13/00* (2006.01)

(52) U.S. Cl.
CPC ............... *H05K 7/10* (2013.01); *H05K 7/1053* (2013.01); *H05K 7/18* (2013.01); *H05K 13/00* (2013.01); *Y10T 29/49117* (2015.01)

(58) Field of Classification Search
CPC . H05K 7/1053; H05K 7/1061; H05K 7/1007; H05K 7/1069; H05K 7/1084
See application file for complete search history.

(56) References Cited

U.S. PATENT DOCUMENTS

| | | | | |
|---|---|---|---|---|
| 6,685,494 B1 * | 2/2004 | McHugh et al. | ............... | 439/342 |
| 6,692,279 B1 * | 2/2004 | Ma | ................. | 439/331 |
| 6,716,050 B1 * | 4/2004 | Ma et al. | ........................ | 439/331 |
| 6,722,909 B1 * | 4/2004 | McHugh et al. | ............... | 439/331 |
| 6,726,500 B1 * | 4/2004 | McHugh et al. | ............... | 439/331 |
| 6,752,636 B2 * | 6/2004 | Ma | ................. | 439/73 |
| 6,776,625 B2 * | 8/2004 | Ma | ................. | 439/73 |
| 6,776,642 B1 * | 8/2004 | McHugh et al. | ............... | 439/331 |
| 6,780,024 B2 * | 8/2004 | Ma | ................. | 439/73 |
| 6,780,025 B2 * | 8/2004 | Ma et al. | ........................ | 439/73 |
| 6,780,041 B1 * | 8/2004 | Ma | ................. | 439/342 |
| 6,799,978 B2 * | 10/2004 | Ma et al. | ........................ | 439/73 |

(Continued)

FOREIGN PATENT DOCUMENTS

| | | |
|---|---|---|
| CN | 1424790 | 6/2003 |
| CN | 101136515 | 3/2008 |

OTHER PUBLICATIONS

Internationalsearching Authority, The International Search Report and the Written Opinion, Oct. 21, 2011, 10 Pages.

(Continued)

*Primary Examiner* — Ross Gushi
(74) *Attorney, Agent, or Firm* — Hewlett-Packard Patent Department

(57) ABSTRACT

A method and apparatus for loading IC's into a socket lid is disclosed. The IC is first loaded into a lid. Once the IC has been loaded into the lid, the lid is rotated into a closed position on the frame. The lid is then locked in place on the frame by rotating at least one locking lever into a closed lacked position, where the locking lever forces the lid down against the socket contacts against a spring.

15 Claims, 13 Drawing Sheets

(56) References Cited

U.S. PATENT DOCUMENTS

| | | | | |
|---|---|---|---|---|
| 6,832,919 B2* | | 12/2004 | Ma et al. | 439/73 |
| 6,848,929 B2* | | 2/2005 | Ma | 439/331 |
| 6,877,990 B2* | | 4/2005 | Liao et al. | 439/41 |
| 6,899,553 B2* | | 5/2005 | Ma et al. | 439/135 |
| 6,905,353 B2* | | 6/2005 | Ma et al. | 439/135 |
| 6,908,327 B2* | | 6/2005 | Ma | 439/331 |
| 6,929,495 B2* | | 8/2005 | Ma | 439/331 |
| 6,932,622 B2* | | 8/2005 | Liao et al. | 439/73 |
| 6,939,140 B2* | | 9/2005 | Liao | 439/41 |
| 6,948,947 B2* | | 9/2005 | Lee et al. | 439/73 |
| 6,957,973 B1* | | 10/2005 | McHugh et al. | 439/331 |
| 6,971,890 B2* | | 12/2005 | Ma | 439/135 |
| 6,971,902 B2* | | 12/2005 | Taylor et al. | 439/342 |
| 6,974,346 B2* | | 12/2005 | Liao | 439/342 |
| 7,001,197 B2* | | 2/2006 | Shirai et al. | 439/331 |
| 7,004,768 B2* | | 2/2006 | Ma et al. | 439/135 |
| 7,014,489 B2* | | 3/2006 | Ma | 439/331 |
| 7,025,603 B2* | | 4/2006 | Ma | 439/73 |
| 7,029,295 B2* | | 4/2006 | Liao | 439/135 |
| 7,029,309 B2* | | 4/2006 | Ma | 439/331 |
| 7,033,183 B2* | | 4/2006 | Ma et al. | 439/41 |
| 7,033,188 B2* | | 4/2006 | Ma | 439/135 |
| 7,033,198 B2* | | 4/2006 | Chiang | 439/331 |
| 7,059,863 B2* | | 6/2006 | Ma | 439/41 |
| 7,059,885 B2* | | 6/2006 | Szu et al. | 439/331 |
| 7,070,427 B2* | | 7/2006 | Liao et al. | 439/135 |
| 7,070,428 B2* | | 7/2006 | Ma | 439/135 |
| 7,080,986 B2* | | 7/2006 | Ma | 439/41 |
| 7,083,457 B2* | | 8/2006 | Ma | 439/331 |
| 7,097,464 B1* | | 8/2006 | McHugh et al. | 439/73 |
| 7,101,210 B2* | | 9/2006 | Lin et al. | 439/331 |
| 7,112,066 B2* | | 9/2006 | Liao et al. | 439/41 |
| 7,112,068 B2* | | 9/2006 | Ma | 439/71 |
| 7,121,843 B2* | | 10/2006 | Byquist | 439/73 |
| 7,121,844 B2* | | 10/2006 | Ma | 439/73 |
| 7,125,259 B2* | | 10/2006 | Hashimoto | 439/73 |
| 7,128,593 B2* | | 10/2006 | Ma | 439/331 |
| 7,134,898 B2* | | 11/2006 | Ma | 439/342 |
| 7,150,643 B2* | | 12/2006 | Ma | 439/331 |
| 7,153,154 B2* | | 12/2006 | Ma et al. | 439/331 |
| 7,160,128 B2* | | 1/2007 | Ma | 439/331 |
| 7,165,988 B2* | | 1/2007 | Ma et al. | 439/331 |
| 7,179,109 B1* | | 2/2007 | Ma | 439/331 |
| 7,189,094 B2* | | 3/2007 | Ma | 439/331 |
| 7,207,822 B2* | | 4/2007 | Szu | 439/342 |
| 7,217,149 B2* | | 5/2007 | Ma | 439/331 |
| 7,234,955 B1* | | 6/2007 | Ho | 439/331 |
| 7,241,161 B2* | | 7/2007 | Mar | 439/331 |
| 7,247,043 B2* | | 7/2007 | Lai | 439/331 |
| 7,264,487 B2* | | 9/2007 | Liao | 439/135 |
| 7,275,950 B1* | | 10/2007 | Ma et al. | 439/342 |
| 7,278,860 B2* | | 10/2007 | Ma | 439/73 |
| 7,291,022 B2* | | 11/2007 | Toda et al. | 439/73 |
| 7,351,087 B2* | | 4/2008 | Szu | 439/342 |
| 7,387,523 B2* | | 6/2008 | Hsu | 439/331 |
| 7,390,202 B2* | | 6/2008 | Ma et al. | 439/135 |
| 7,396,248 B2* | | 7/2008 | Zhang | 439/331 |
| 7,402,065 B1* | | 7/2008 | Polnyi | 439/331 |
| 7,435,124 B2* | | 10/2008 | Ma et al. | 439/331 |
| 7,438,580 B1* | | 10/2008 | Aoki et al. | 439/331 |
| 7,473,121 B2* | | 1/2009 | Fan et al. | 439/342 |
| 7,476,115 B2* | | 1/2009 | Zhang et al. | 439/331 |
| 7,476,122 B2* | | 1/2009 | Zhang | 439/485 |
| 7,497,716 B2* | | 3/2009 | Hsu et al. | 439/331 |
| 7,497,717 B2* | | 3/2009 | Zhang | 439/331 |
| 7,510,403 B2* | | 3/2009 | Ma | 439/73 |
| 7,566,225 B1* | | 7/2009 | Ho | 439/41 |
| 7,575,449 B1* | | 8/2009 | Cai | 439/135 |
| 7,575,461 B2* | | 8/2009 | Fan | 439/331 |
| 7,588,442 B2* | | 9/2009 | Ma | 439/73 |
| 7,628,651 B2* | | 12/2009 | Yeh | 439/607.37 |
| 7,666,020 B2* | | 2/2010 | Zhang et al. | 439/331 |
| 7,677,912 B2* | | 3/2010 | Zhang | 439/331 |
| 7,699,636 B2* | | 4/2010 | Ma et al. | 439/331 |
| 7,699,637 B2* | | 4/2010 | Yeh | 439/331 |
| 7,717,729 B2* | | 5/2010 | Zhang et al. | 439/331 |
| 7,717,731 B2* | | 5/2010 | Liao | 439/331 |
| 7,744,396 B2* | | 6/2010 | Taguchi et al. | 439/331 |
| 7,815,454 B2* | | 10/2010 | Fan | 439/331 |
| 7,819,687 B2* | | 10/2010 | Ma | 439/331 |
| 7,828,565 B2* | | 11/2010 | Ma et al. | 439/135 |
| 7,828,577 B2* | | 11/2010 | Yeh | 439/331 |
| 7,841,883 B2* | | 11/2010 | Yeh | 439/330 |
| 7,845,964 B2* | | 12/2010 | Fan | 439/331 |
| 7,867,006 B2* | | 1/2011 | Yeh | 439/331 |
| 7,878,835 B2* | | 2/2011 | Fan | 439/331 |
| 7,896,677 B2* | | 3/2011 | Fan | 439/331 |
| 7,927,121 B2* | | 4/2011 | Ma et al. | 439/331 |
| 7,988,459 B2* | | 8/2011 | Ulen et al. | 439/73 |
| 8,052,439 B2* | | 11/2011 | Fan et al. | 439/135 |
| 8,052,451 B2* | | 11/2011 | Yeh | 439/331 |
| 8,137,121 B2* | | 3/2012 | Dai | 439/135 |
| 8,142,201 B2* | | 3/2012 | Fan | 439/41 |
| 8,162,685 B2* | | 4/2012 | Tang et al. | 439/331 |
| 8,233,284 B2* | | 7/2012 | Ju et al. | 361/753 |
| 8,292,649 B2* | | 10/2012 | Yeh | 439/331 |
| 8,337,231 B2* | | 12/2012 | Hsu et al. | 439/342 |
| 8,353,708 B2* | | 1/2013 | Hsu | 439/67 |
| 8,403,681 B2* | | 3/2013 | Chien et al. | 439/66 |
| 8,425,245 B2* | | 4/2013 | Tsai et al. | 439/331 |
| 8,439,693 B2* | | 5/2013 | Yeh et al. | 439/135 |
| 8,460,012 B2* | | 6/2013 | Zhou et al. | 439/73 |
| 8,506,316 B2* | | 8/2013 | Tsai et al. | 439/331 |
| 8,597,035 B1* | | 12/2013 | Terhune et al. | 439/73 |
| 8,647,138 B1* | | 2/2014 | Chen | 439/331 |
| 8,734,177 B2* | | 5/2014 | Tsai et al. | 439/342 |
| 8,834,191 B2* | | 9/2014 | Yeh et al. | 439/331 |
| 8,902,611 B2* | | 12/2014 | Bridges et al. | 361/807 |
| 8,979,565 B2* | | 3/2015 | Yeh | 439/331 |
| 8,979,566 B2* | | 3/2015 | Yeh | 439/331 |
| 8,979,575 B2* | | 3/2015 | Cheng et al. | 439/487 |
| 8,998,625 B2* | | 4/2015 | Yeh | 439/136 |
| 9,011,170 B2* | | 4/2015 | Sauer et al. | 439/331 |
| 9,054,473 B2* | | 6/2015 | Kyle | 1/1 |
| 2004/0058567 A1* | | 3/2004 | Ma | 439/73 |
| 2004/0067672 A1 | | 4/2004 | Ma | |
| 2004/0095693 A1 | | 5/2004 | Shirai et al. | |
| 2004/0110396 A1* | | 6/2004 | Ma | 439/73 |
| 2004/0115966 A1* | | 6/2004 | Ma et al. | 439/73 |
| 2004/0259407 A1* | | 12/2004 | Chiang | 439/331 |
| 2004/0266245 A1* | | 12/2004 | Liao | 439/331 |
| 2005/0009377 A1* | | 1/2005 | Liao | 439/41 |
| 2005/0014400 A1* | | 1/2005 | Liao et al. | 439/73 |
| 2005/0032408 A1* | | 2/2005 | Liao et al. | 439/331 |
| 2005/0059288 A1* | | 3/2005 | Lin et al. | 439/342 |
| 2005/0106905 A1* | | 5/2005 | Ma | 439/73 |
| 2005/0106922 A1* | | 5/2005 | Ma | 439/331 |
| 2005/0106923 A1* | | 5/2005 | Ma | 439/331 |
| 2005/0124188 A1* | | 6/2005 | Ma | 439/73 |
| 2005/0153581 A1* | | 7/2005 | Ma et al. | 439/73 |
| 2005/0233628 A1* | | 10/2005 | Yang et al. | 439/331 |
| 2005/0287858 A1* | | 12/2005 | Toda et al. | 439/331 |
| 2006/0040524 A1* | | 2/2006 | Liao et al. | 439/73 |
| 2006/0116007 A1* | | 6/2006 | Ma | 439/73 |
| 2006/0116015 A1* | | 6/2006 | Ju | 439/331 |
| 2006/0116016 A1 | | 6/2006 | Szu | |
| 2006/0121765 A1* | | 6/2006 | Ma | 439/331 |
| 2006/0128201 A1* | | 6/2006 | Ju | 439/331 |
| 2006/0141840 A1* | | 6/2006 | Ma | 439/331 |
| 2006/0178021 A1* | | 8/2006 | McHugh et al. | 439/73 |
| 2007/0049066 A1* | | 3/2007 | Ju | 439/73 |
| 2007/0134950 A1* | | 6/2007 | Huang | 439/73 |
| 2007/0155215 A1* | | 7/2007 | Hsu | 439/331 |
| 2007/0173081 A1* | | 7/2007 | Yu et al. | 439/73 |
| 2007/0281534 A1* | | 12/2007 | Xu et al. | 439/331 |
| 2008/0045048 A1* | | 2/2008 | Ma | 439/73 |
| 2008/0057751 A1* | | 3/2008 | Zhang | 439/73 |
| 2008/0081489 A1* | | 4/2008 | MacGregor et al. | 439/71 |
| 2008/0113545 A1* | | 5/2008 | Zhang et al. | 439/345 |
| 2008/0153323 A1* | | 6/2008 | Ju et al. | 439/73 |
| 2008/0160814 A1* | | 7/2008 | Howell | 439/331 |
| 2008/0242122 A1* | | 10/2008 | Ma et al. | 439/66 |
| 2009/0075493 A1* | | 3/2009 | Ma | 439/55 |
| 2009/0170350 A1* | | 7/2009 | Xu et al. | 439/73 |

(56) References Cited

U.S. PATENT DOCUMENTS

| | | |
|---|---|---|
| 2009/0176397 A1* | 7/2009 | Yeh et al. ............... 439/331 |
| 2010/0029108 A1* | 2/2010 | Fan ........................ 439/135 |
| 2010/0093201 A1 | 4/2010 | Yeh |
| 2010/0330824 A1* | 12/2010 | Ulen et al. ............... 439/73 |
| 2012/0156919 A1* | 6/2012 | Yeh et al. ............... 439/370 |
| 2013/0084737 A1* | 4/2013 | Cai et al. ................ 439/573 |
| 2013/0288505 A1* | 10/2013 | Hung et al. ............. 439/342 |
| 2013/0322037 A1* | 12/2013 | Tan et al. ............... 361/752 |
| 2014/0011377 A1* | 1/2014 | Yeh ........................ 439/73 |
| 2014/0092573 A1* | 4/2014 | Llapitan et al. ......... 361/772 |
| 2014/0329404 A1* | 11/2014 | Yeh et al. ............... 439/372 |
| 2014/0342611 A1* | 11/2014 | Yeh et al. ............... 439/625 |

OTHER PUBLICATIONS

SIPO, Search Report, mailed Feb. 14, 2015, Patent App. No. 201180068623.7, 2 pps.

* cited by examiner

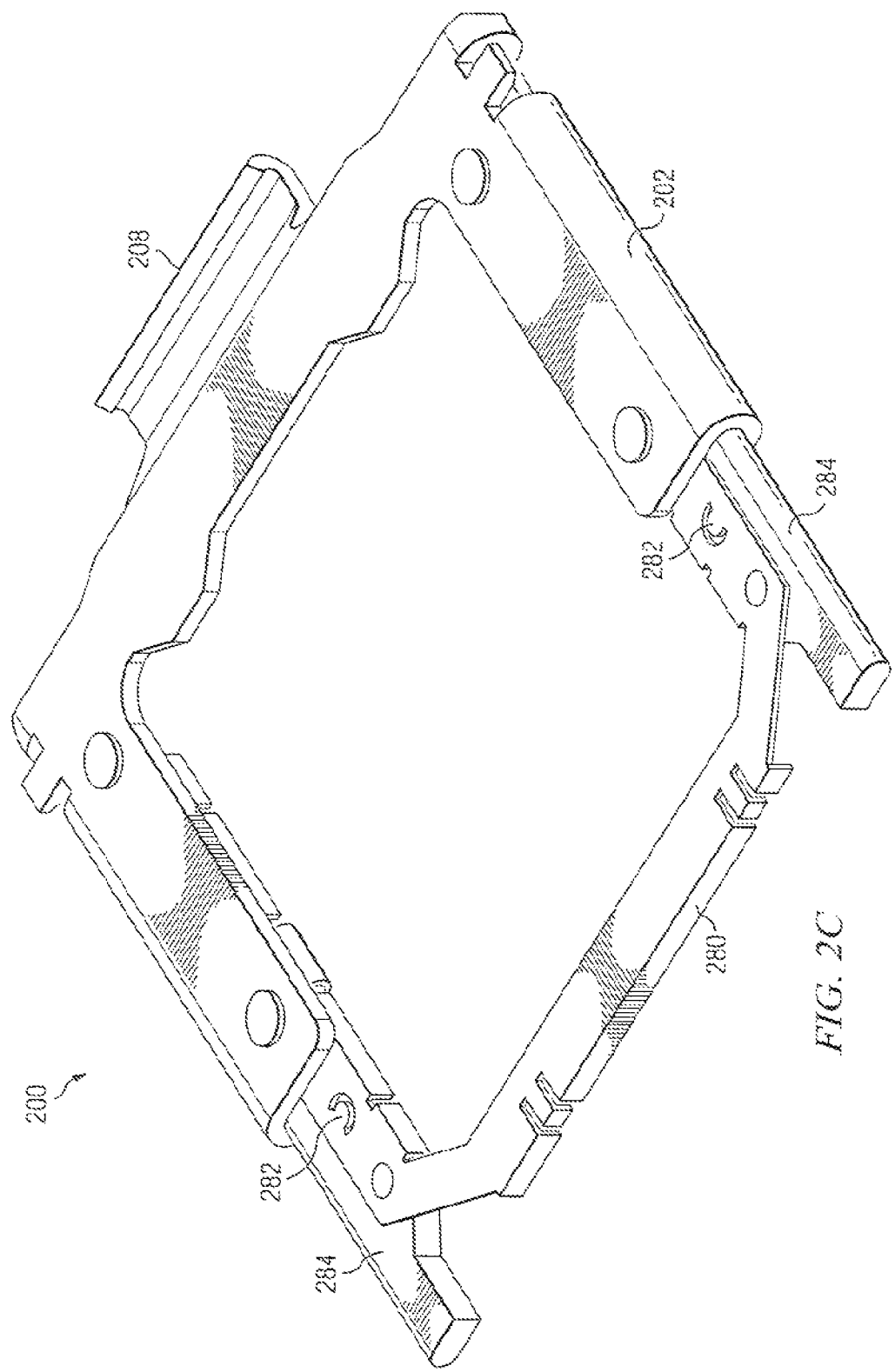

SPRING LOADED LID

BACKGROUND

Many integrated circuits (IC) are mounted to a printed circuit (PC) board using a socket. One type of socket is a land grid arrays (LGA) socket. Older style sockets have holes in the socket that mate with pins attached to the underside of an IC. LGA sockets have protruding pins or spring contacts which touch contact pads on the underside of an IC. LGA sockets typically do not require any insertion force when installing the IC into the socket. The IC is held into the socket against the spring contacts by a lid. The lid is clamped in place once the IC has been loaded into the socket.

Aligning and inserting or removing the IC from the socket can be difficult. Many ICs have special tools designed to assist the insertion of the IC into the socket. Even using the special tool the spring contacts may be damaged when the IC is being inserted or removed from the socket. When the spring contacts in the socket become damaged, the socket must be replaced.

BRIEF DESCRIPTION OF THE DRAWINGS

FIG. 2C is an isometric top view of detachable lid assembly 200 in an example embodiment of the invention.

DETAILED DESCRIPTION

FIGS. 1-4 and the following description depict specific examples to teach those skilled in the art how to make and use the best mode of the invention. For the purpose of teaching inventive principles, some conventional aspects have been simplified or omitted. Those skilled in the art will appreciate variations from these examples that fall within the scope of the invention. Those skilled in the art will appreciate that the features described below can be combined in various ways to form multiple variations of the invention. As a result, the invention is not limited to the specific examples described below, but only by the claims and their equivalents.

In one example embodiment of the invention, an LGA socket will have a spring loaded lid. The spring loaded lid may have a bracket attached to the lid. The IC will be mounted into the lid/bracket. The spring will force the lid away from the contacts in the socket until a locking lever is moved into a closed position. Because the spring loaded lid is force away from the socket contacts, damage to the contacts in the socket may be reduced.

Figure 1A:
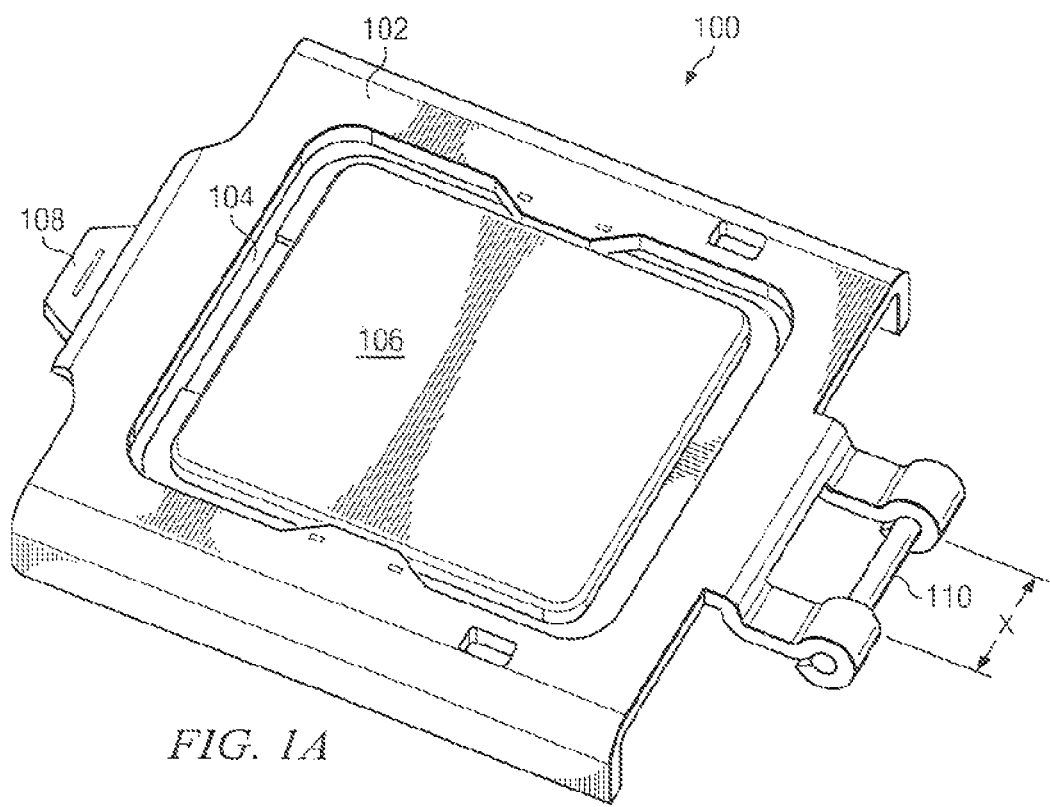
FIG. 1A is an isometric top view of a detachable lid assembly 100 in an example embodiment of the invention.

FIG. 1A is an isometric top view of a detachable lid assembly 100 in an example embodiment of the invention. Detachable lid assembly 100 comprises lid 102, bracket 104 and integrated circuit (IC) 106. Lid 102 is typically fabricated from a stiff material, for example metal. Bracket 104 is fabricated from a flexible material, for example Thermal Plastic Polyurethane (TPU). IC 106 may be any type of semiconductor device, for example a CPU, an application specific integrated circuit (ASIC), a memory device, or the like. Lid 102 has at least one tongue 108 that extends from one side of lid 102. Lid 102 has hinge pin 110 attached to lid 102 on the opposite side from tongue 106.

Figure 1D:
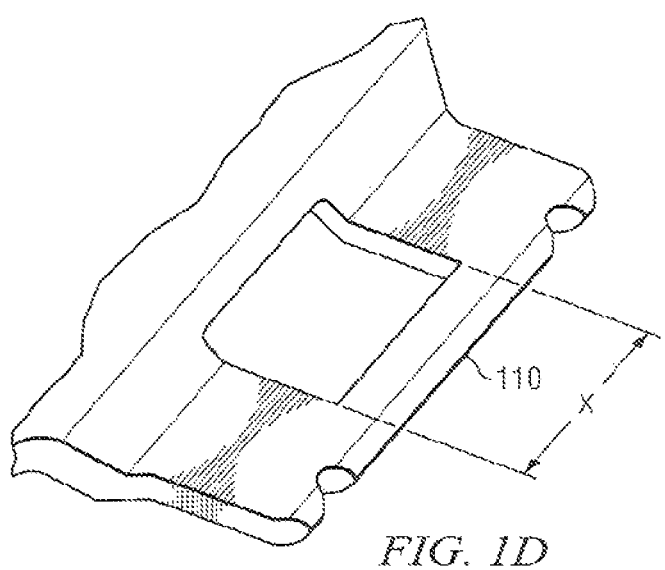
FIG. 1D is an isometric top view of a section of a detachable lid assembly in an example embodiment of the invention.
Figure 1B:
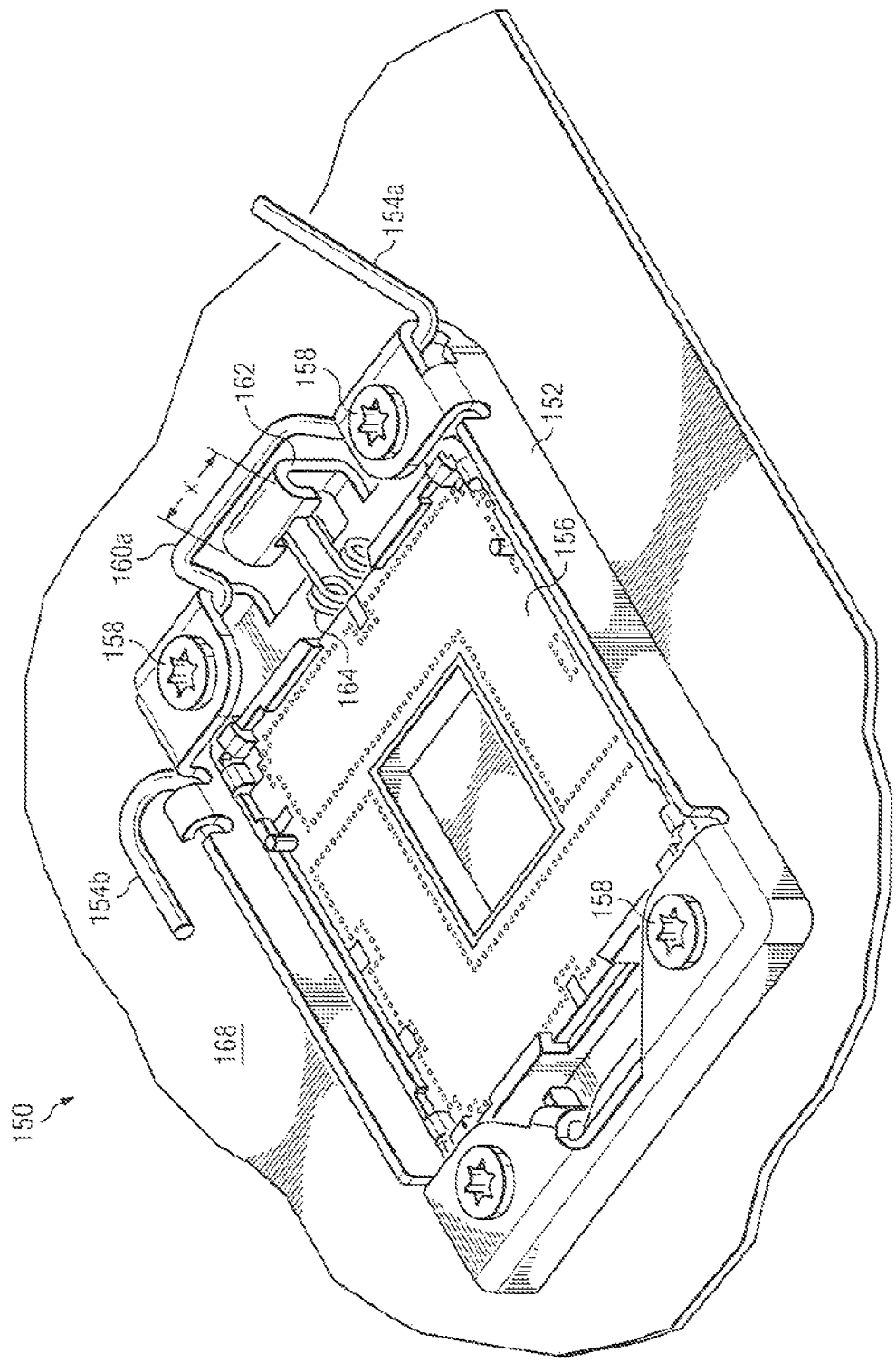
FIG. 1B is an isometric top view of a socket bottom 150 in an example embodiment of the invention.

FIG. 1B is an isometric top view of a socket bottom 150 in an example embodiment of the invention. Socket bottom 150 comprises frame 152, two locking levers (154a and 154b), socket contacts 156 and spring 164. Socket bottom 150 is attached to PC board 168 with screws 158. In some example embodiments of the invention, a stiffener plate (not shown) maybe used on the bottom side of PC board 168 capturing PC board 168 between the stiffener plate and the frame 152. The PC board 168 may be the mother board for a personal computer, the processor board of a blade, the memory board of a memory system, or the like.

A U-shaped tab 162 is formed at one end of frame 152. The inside of U-shaped tab 162 forms a pivot channel that males with hinge pin 110 on lid 102. A pivot channel is a structure that allows the hinge pin to move vertically with respect to the frame, but restricts horizontal motion of the hinge pin. In addition the pivot channel allows the hinge pin to rotate inside the pivot channel about the long axis of the hinge pin. During assembly, the detachable lid assembly is positioned at an angle with respect to socket base 150 with the hinge pin closest to the socket base. The hinge pin 110 is then snapped into the U-shaped tab on the frame 152. When detachable lid 102 is snapped into socket base 150, hinge pin 110 fits into the pivot channel (inside the curved section of U-shaped tab 162). Spring 164, forces hinge pin 110 against the top of the pivot channel. The width X' of U-shaped tab 162 fits inside the gap X of hinge pin 110. In one example embodiment of the invention, the position of hinge pin 110 with respect to the pivot channel is used to align IC 106 to the socket contacts 156. In other embodiments, the IC may be aligned to the socket contacts 156 by one or more edges surrounding socket contacts 156. Once the detachable lid 102 has been snapped into the frame, the lid 102 can be rotated, inside the pivot channel, onto the socket bottom 150. In the open position detachable lid 102 will make an angle of between 45 and 115 degrees with respect to the socket contacts. The two locking levers can then be rotated from the open position into the closed position. As the locking levers are rotated into the closed position, locking bars 160a and 160b mate with the lid 102 and force the IC mounted in the lid 102 against the socket contacts 156.

Figure 1C:
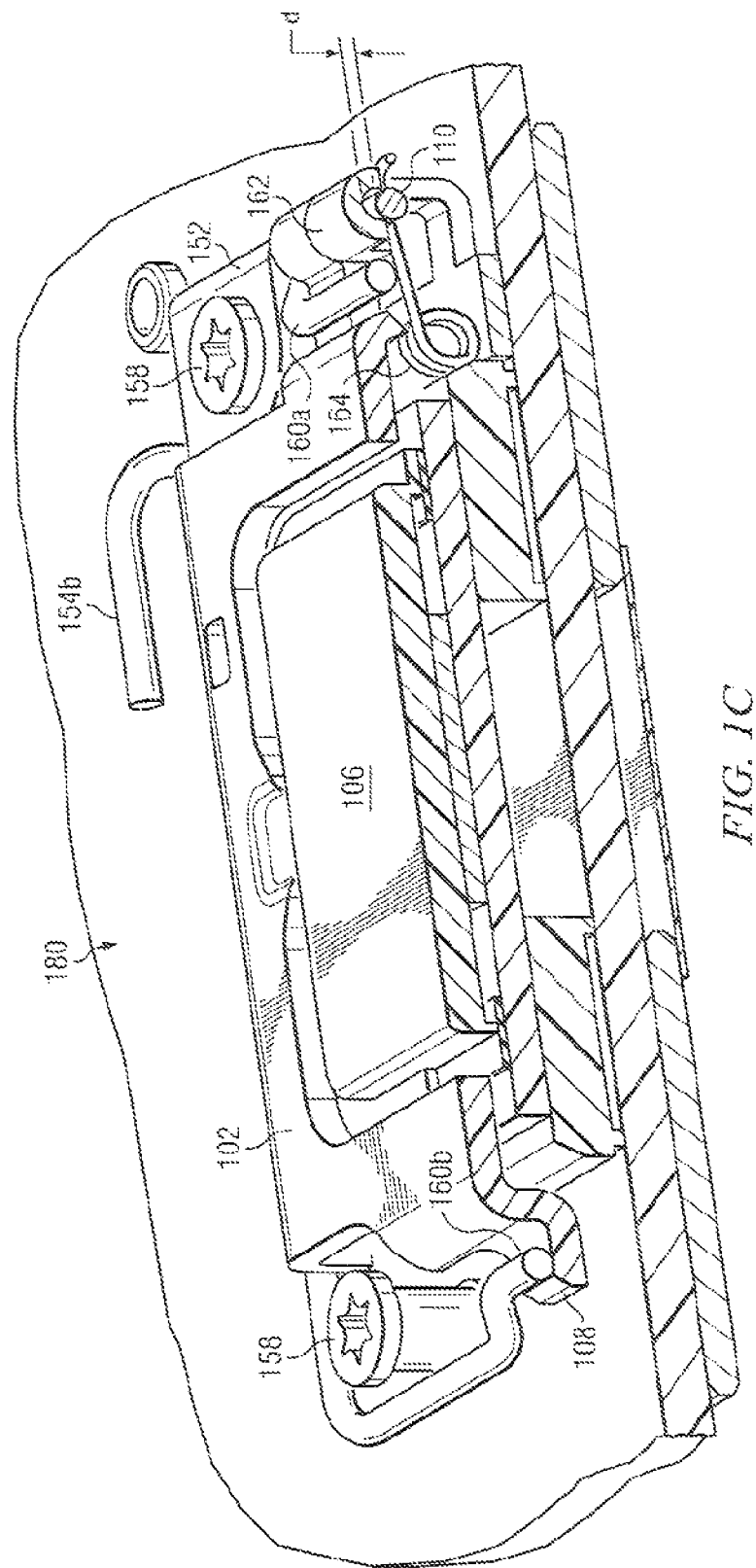
FIG. 1C is an isometric top cutaway view of socket assembly 180 in an example embodiment of the invention.

FIG. 1C is an isometric top cutaway view of socket assembly 180 in an example embodiment of the invention. Socket assembly 180 comprises detachable lid 102, IC 106, frame 152, spring 164, screws 158, locking lever 154b and locking bars 160a and 160b. FIG. 1C shows detachable lid 102 in the closed position with both locking levers in the closed position. Locking bar 150b is shown forcing tongue 108 downward, and locking bar 160a is shown forcing hinge pin 110 downward. Before locking lever 154a (see FIG. 1b) is rotated into the closed position, looking bar 160a does not force hinge pin 110 downwards. Therefore when locking lever 160a is in the open position, spring 164 keeps hinge pin 110 pressed against the top of the pivot channel. When locking lever 154a (see FIG. 1b) is rotated into the closed position, locking bar 160a forces hinge pin 110 downwards by distance d, forcing the underside of IC 106 against the socket contacts 156. In one example embodiment of the invention distance d is between 0.5-3.5 mm. Distance d may be 2.4 mm.

Because spring 164 keeps hinge pin 110 up against the top of the pivot channel until locking lever is rotated into the closed position, the bottom surface of IC 106 may not make contact with socket contacts 156 until IC 106 is properly aligned with the socket contacts 156. In one embodiment of the invention, the bottom surface of the IC may not touch the socket contacts when the hinge pin is at the top of the pivot channel and the lid is in the closed position. In other embodiment, the bottom surface of the IC may be resting on, or slightly compressing, the socket contacts when the hinge pin is at the top of the pivot channel and the lid is in the closed position. In one example embodiment of the invention, the force acting against hinge pin 110 by spring 164 is between 1 lbs and 3 lbs when the hinge pin is at the top of the pivot channel, and between 6 lbs and 10 lbs when the hinge pin is at the bottom of the pivot channel. The spring force may be 2 lbs when the hinge pm is at the top of the pivot channel, and 7 lbs when the hinge pin is at the bottom of the pivot channel. In some example embodiments the spring force is supplies by two springs. In one example embodiment, the lid 200 may not be detachable, but may be permanently attached to the socket frame.

In another example embodiment of the invention, hinge pin 110 may not be cylindrical in shape. FIG. 1D is an isometric top view of a section of a detachable lid assembly in another example embodiment of the invention. Hinge pin 110 in FIG. 1D is not a separated cylindrical part held by tabs of the lid 102. Hinge pin 110 in FIG. 1D is formed as part of the sheet metal of lid 102 and comprises a flat section of length X. When detachable lid 102 is snapped into socket base 150, the flat hinge pin 110 fits into the pivot channel (inside the curved section of U-shaped tab 162). Spring 164, forces hinge pin 110 against the top of the pivot channel. The width X' of U-shaped tab 162 fits inside the gap X of hinge pin 110. The flat hinge pin is able to move vertically with respect to the frame, but is restricted in horizontal motion. In addition the pivot channel allows the flat hinge pin to rotate inside the pivot channel about the long axis of the hinge pin.

Figure 2A:
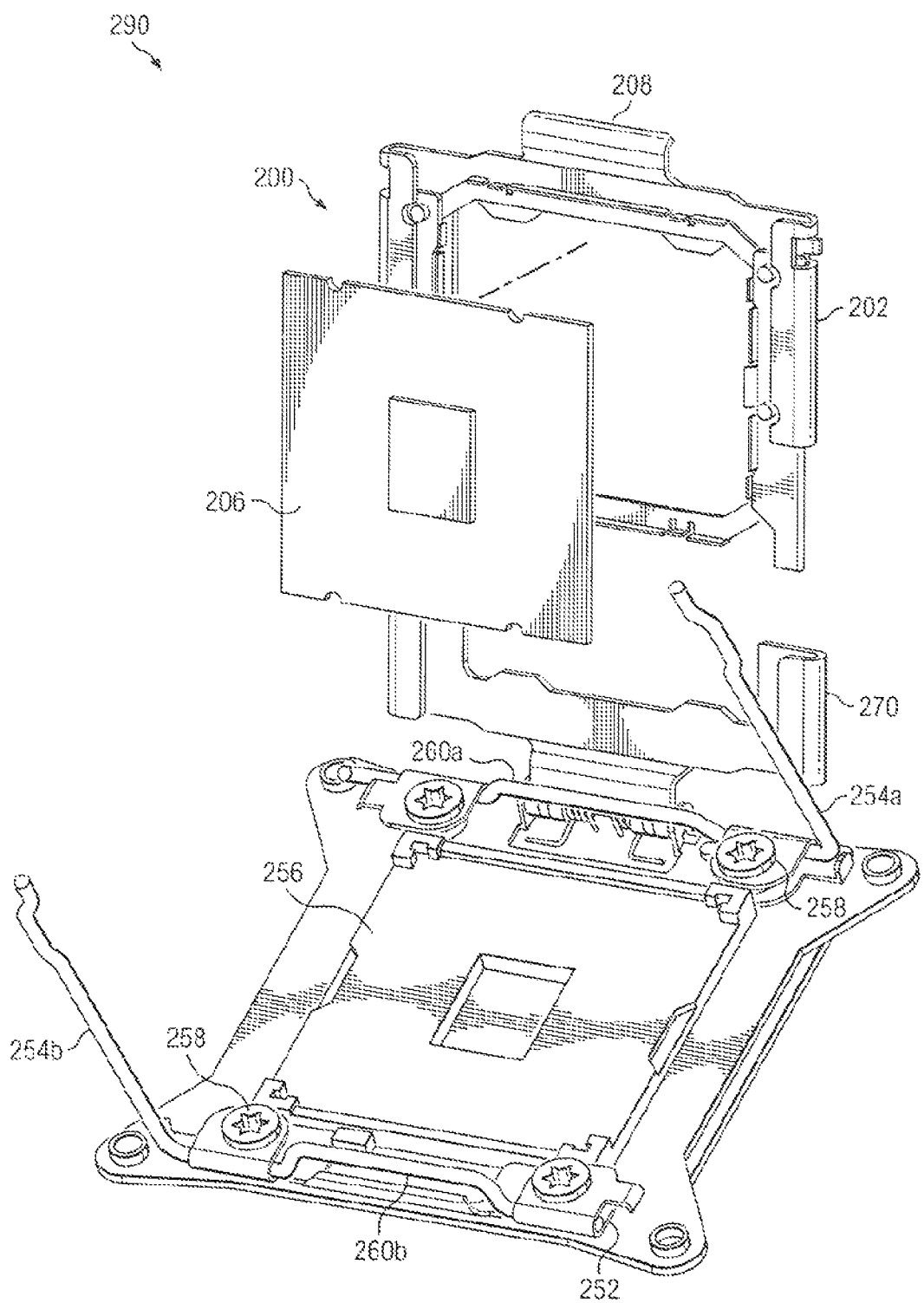
FIG. 2A is an isometric top view of a socket assembly 290 in an example embodiment of the invention.

In another example embodiment of the invention, the lid may be divided into two parts: a detachable part and a spring loaded part. FIG. 2A is an isometric top view of a socket assembly 290 in an example embodiment of the invention. Socket assembly 290 comprises: frame 252, screws 258, socket contacts 256, two locking levers 254a and 254b, detachable lid 200, spring loaded lid 270 and IC 206. FIG. 2a shows detachable lid 200 detached from spring loaded lid 270 with IC 206 ready to be installed into detachable lid 200. Spring loaded lid 270 is shown in the open position making an angle of approximately 95 degrees with respect to socket contacts 256.

Figure 3A:
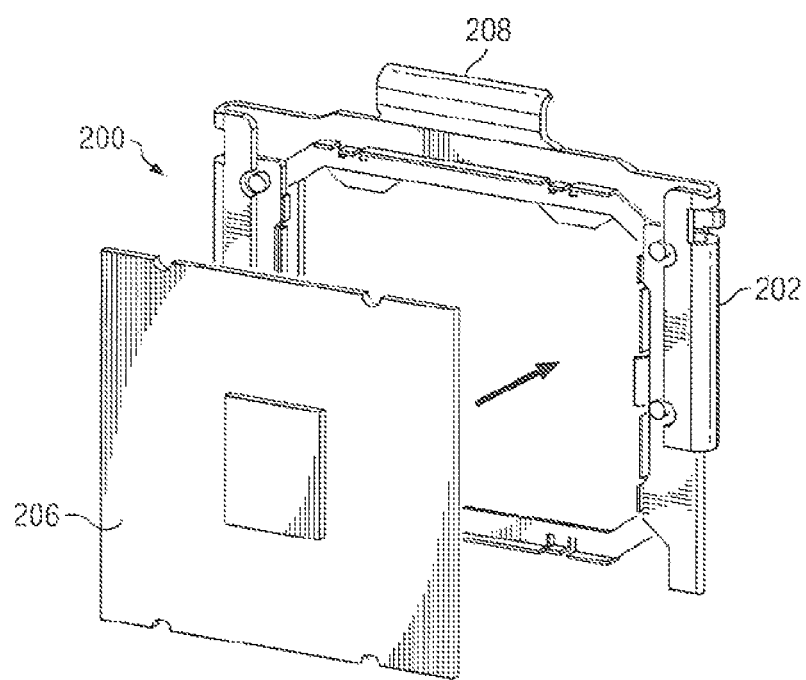
FIG. 3(A-C) is a pictorial representation for the assembly steps of a socket assembly in an example embodiment of the invention.
Figure 3B:
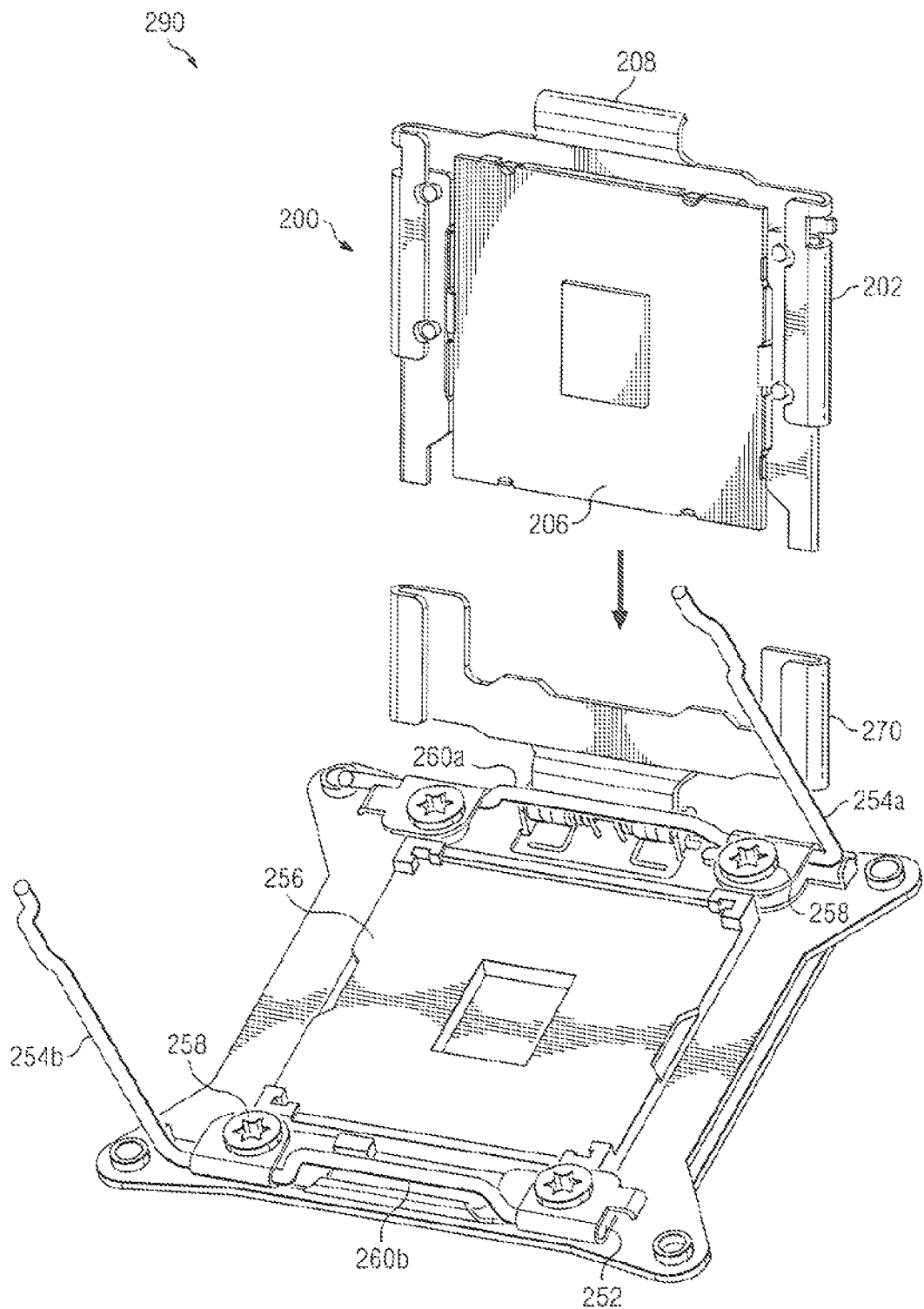
Figure 3C:
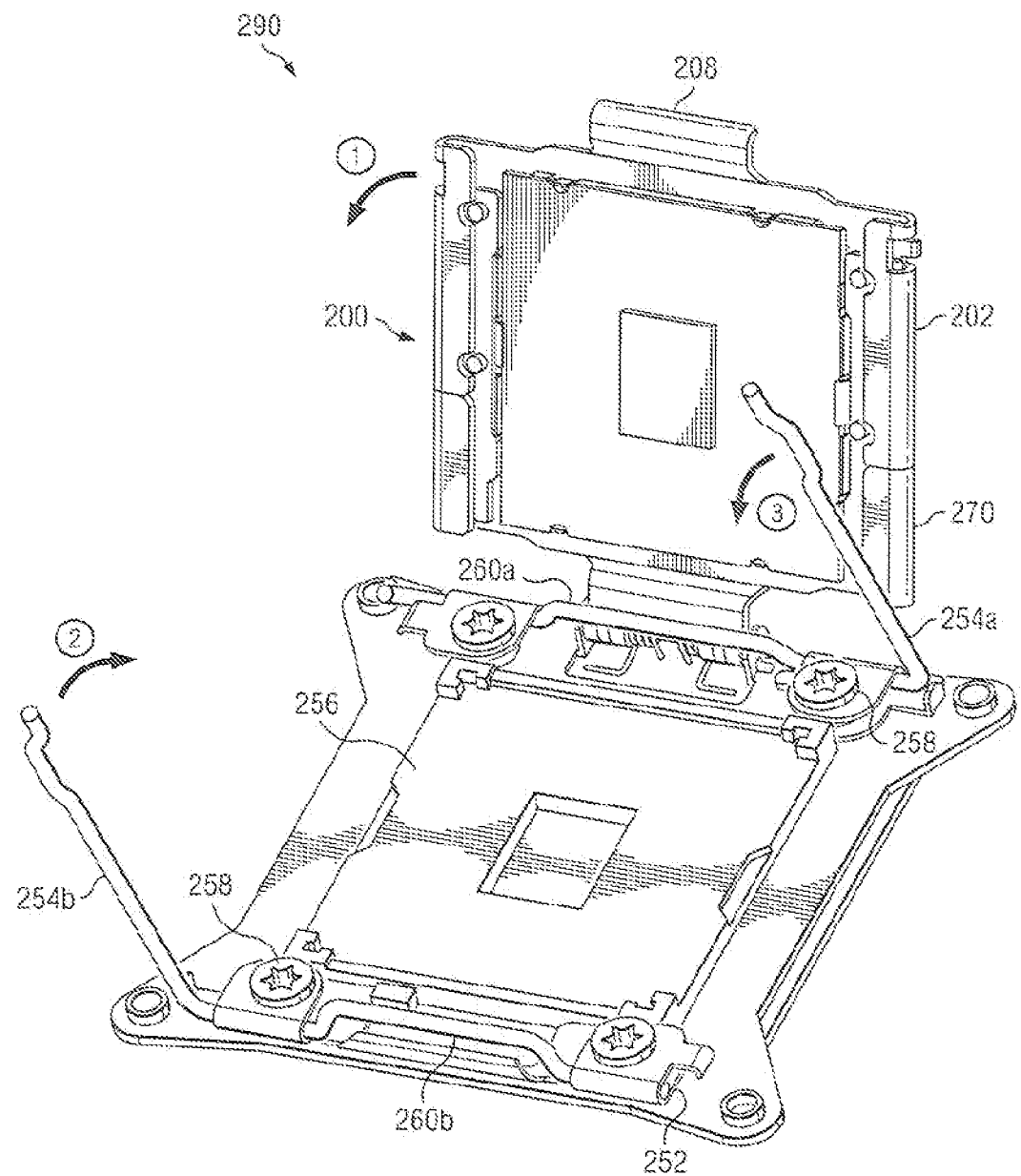

FIG. 3(A-C) is a pictorial representation for the steps used to assemble a socket assembly in an example embodiment of the invention. At step one (FIG. 3a) the IC is loaded into the detachable lid. At step 2 (FIG. 3b) the detachable lid is inserted into the spring loaded lid while the spring loaded lid is in its open position. Spring loaded lid makes a large angle (45-115 degrees) with respect to socket contacts 256 when in the open position. At step 3 (FIG. 3c) the two part lid (the detachable lid and the spring loaded lid) is rotated down onto the socket bottom (as shown by arrow 1). At step 4 (FIG. 3c) the lower locking lever is rotated into its closed position (shown by arrow 2), thereby capturing tongue 208 and forcing one end of the IC mounted in the two part lid down against the socket contacts. At step 5 (FIG. 3c) the upper locking level is rotated into its closed position (as shown by arrow 3), compressing springs 264 and pushing hinge pin 210 down in the pivot channel, thereby forcing the other end of IC mounted in the two part lid down against the socket contacts.

Figure 2B:
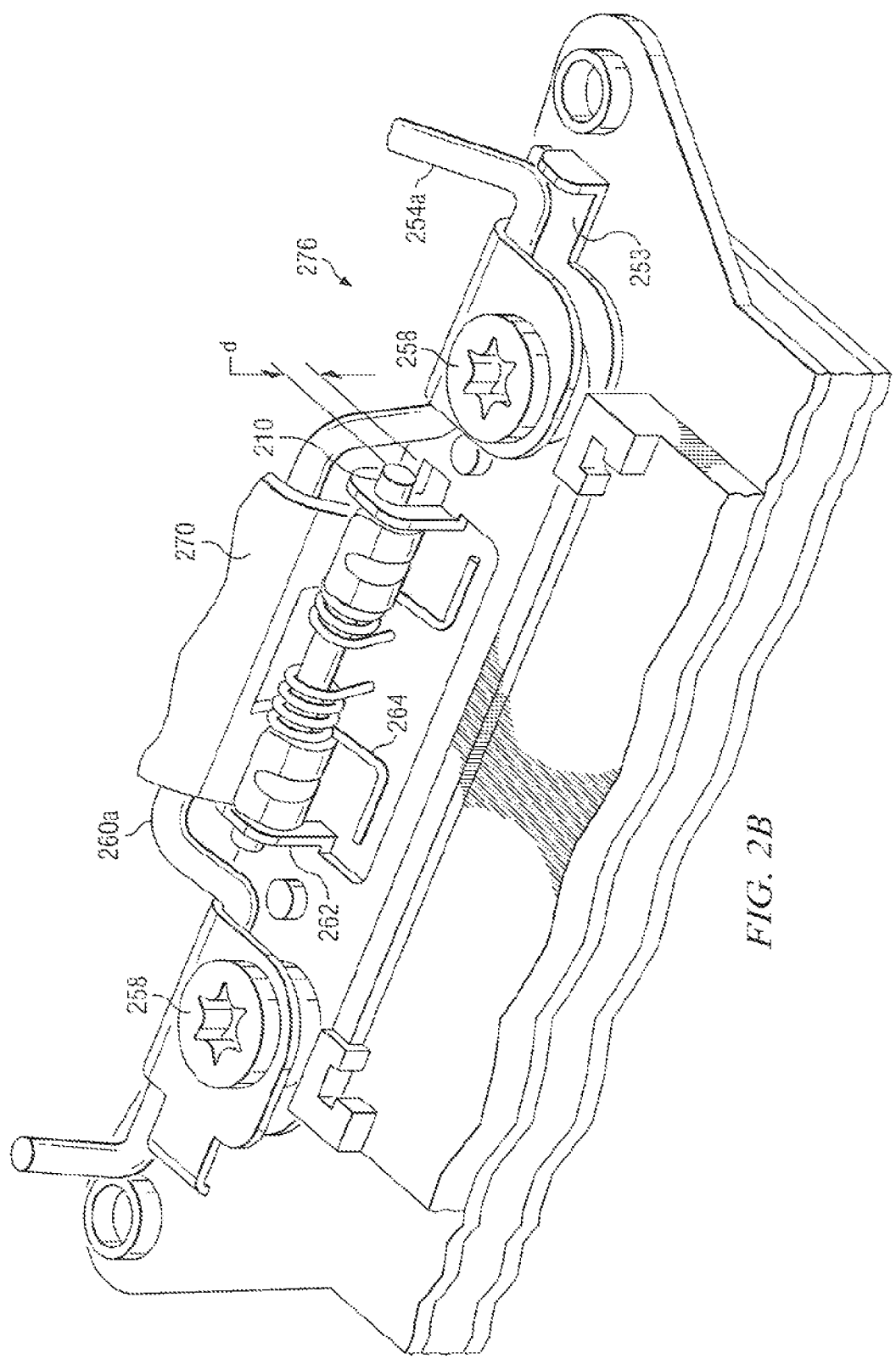
FIG. 2B is a close-up isometric view of the spring loading part of socket assembly 290.

The two locking levers are installed into frame 252 with one locking lever
mounted at each end of frame 252 (see FIG. 2a). Each locking lever (254a and 254b) has a locking bar 260a and 260b. Locking bar 260a is shows in front of spring loaded lid 270 (for clarity). In actual operation, locking bar 260a is located behind spring loaded lid 270 (as shown in FIG. 2b). Both locking levers (254a and 254b) can be rotated between an open position and a closed position. Both locking levers are shown in the open position in FIG. 2a. When locking lever 254b is rotated into its closed position, locking bar 260b captures tongue 208, forcing detachable lid downward. When locking lever 254a is rotated into its closed position, locking bar 260a forces spring loaded lid downward.

FIG. 2B is a close-up isometric view of the spring loading part of socket assembly 290. A hinge pin 210 is attached to one end of spring loaded lid 270. Hinge pin 210 is captured inside slots formed in two parallel tabs 262 bent vertically from frame 253. The two slots form a pivot channel. A pivot channel is a structure that allows the hinge pin to move vertically with respect to the frame, but restricts horizontal motion of the hinge pin. In addition the pivot channel allows the hinge pin to rotate inside the pivot channel about the cylindrical axis of the hinge pin. At least one spring 264 is attached to hinge pin 210 and pushes against the bottom of socket assembly 290, forcing hinge pin 210 up into the top of the pivot channel. Hinge pin 210 can move distance d downwards inside the pivot channel by compressing spring 264. Hinge pin 210 is free to rotate around its cylindrical axis inside pivot channel. Locking lever 254a is shown in the open position with locking bar 260a behind spring loaded lid.

Figure 2D:
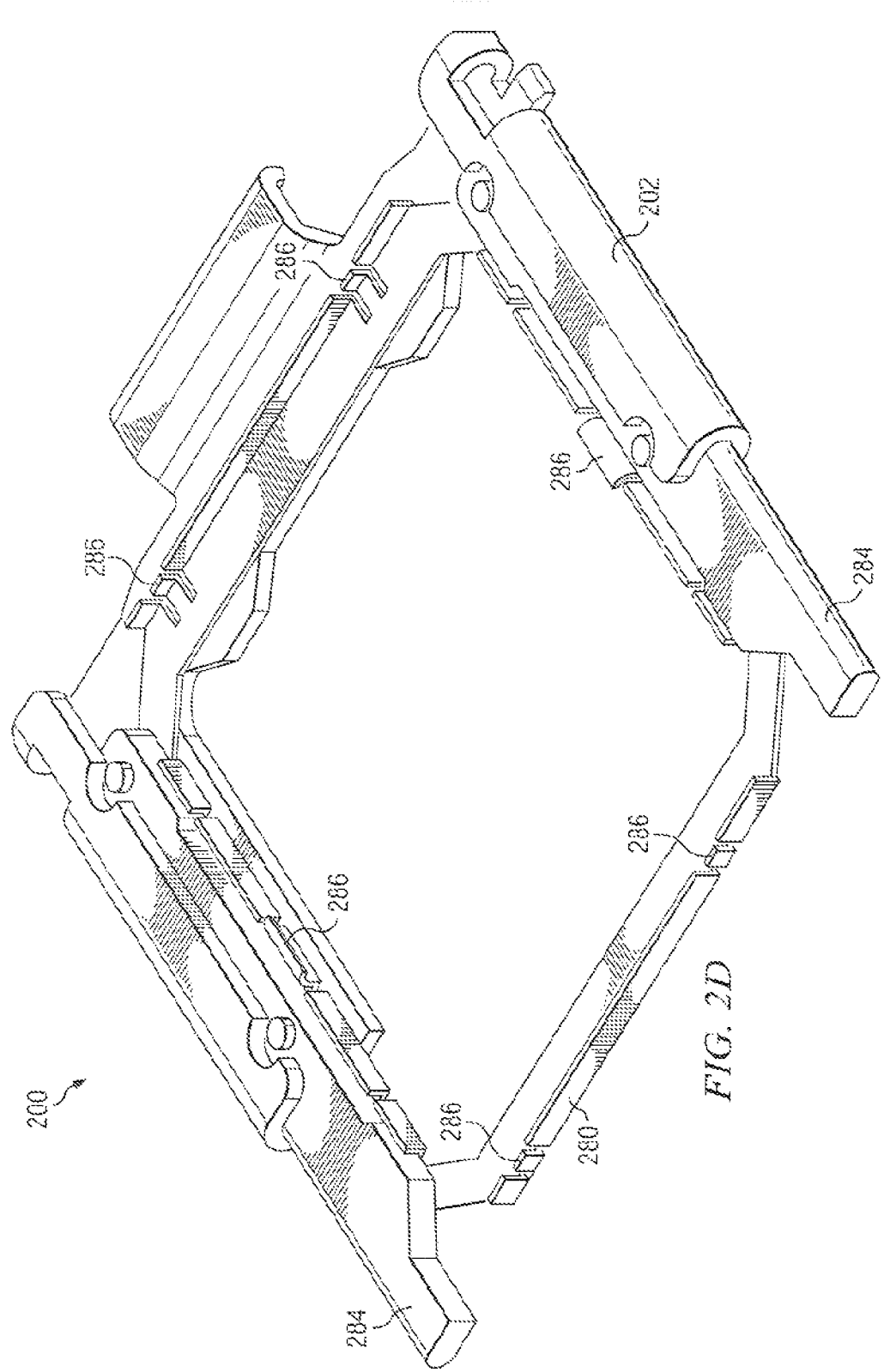
FIG. 2D is an isometric bottom view of detachable lid assembly 200 in an example embodiment of the invention.

FIG. 2C is an isometric top view of detachable lid assembly 200 in an example embodiment of the invention. FIG. 2D is an isometric bottom view of detachable lid assembly 200 in an example embodiment of the invention. Detachable lid assembly 200 comprises lid 202, IC holder 280, and 2 stiffeners 284. Lid 202 is fabricated from a stiff material, for example metal. Lid 202 has tongue 208 formed at one end IC holder 280 is attached to lid 202. Stiffeners 284 are attached to IC holder with IC holder in-between the lid and the stiffeners (see FIG. 2d). IC holder is formed to retain an IC inserted into IC holder. In one embodiment, IC holder 280 may be fabricated from a flexible material and uses an interference, fit to retain the IC in another embodiment, the IC may snap into IC holder 280 and be retained by the snap features in IC holder 280.

Detachable lid is configured to be inserted into the spring loaded lid 270. Stiffeners 284 mate with channels formed in the spring loaded lid, allowing the detachable lid to be slid into the spring loaded lid. IC holder may have 2 "click" detents 282 formed in the top surface of IC holder 280, one on each side. The "click" detents 282 snap into corresponding features in the spring loaded lid 270 to let a user know when the detachable lid has been fully inserted into the spring loaded lid 270. By depressing the "click" features, detachable lid can be removed from the spring loaded lid.

Figure 4A:
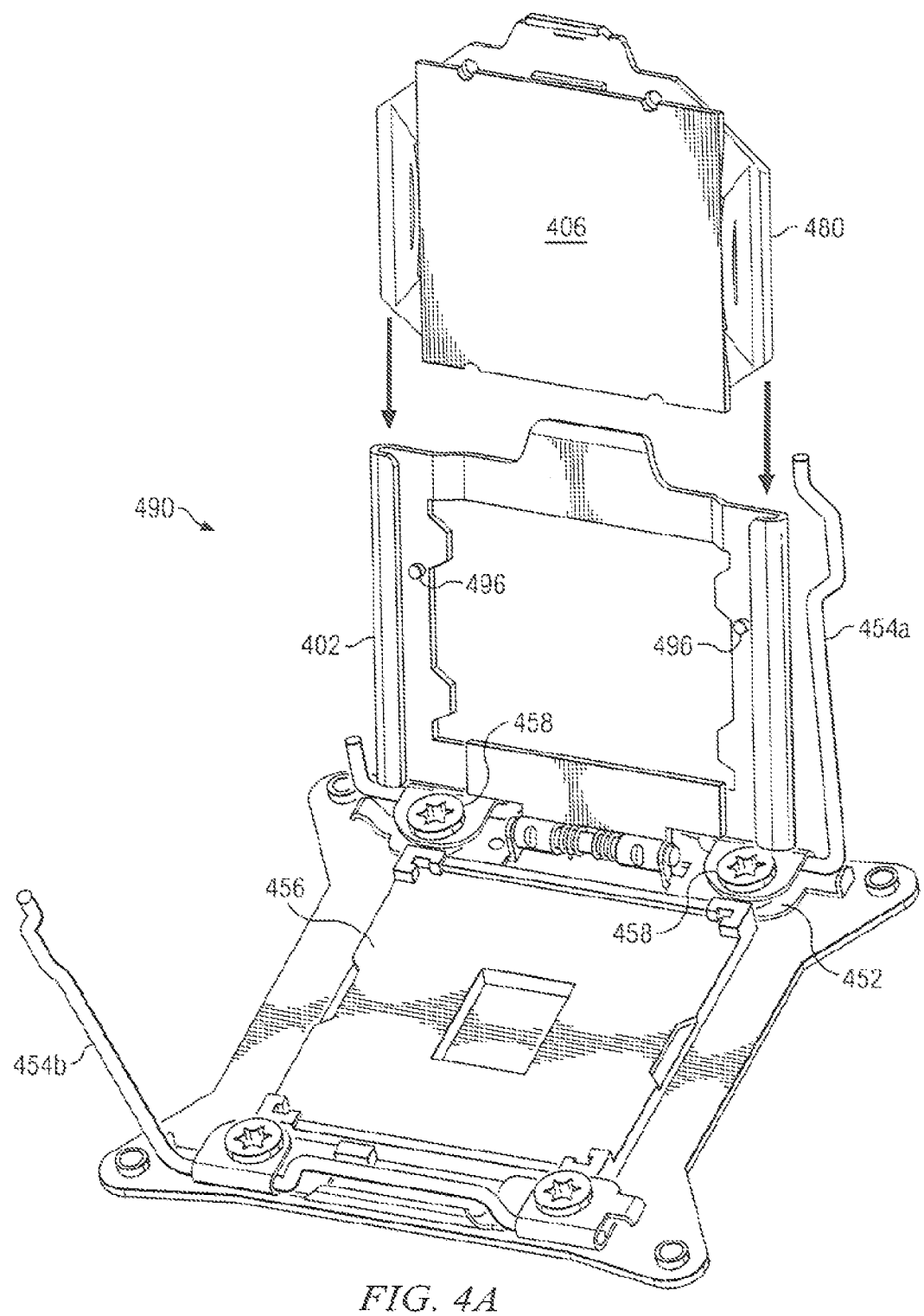
FIG. 4A is an isometric top view of a socket assembly 490 in as example embodiment of the invention.

In another example embodiment of the invention, the spring loaded lid may have an independent detachable IC holder that slides into the lid when the lid is in the open position. FIG. 4A is an isometric top view of a socket assembly 490 in an example embodiment of the invention. Socket assembly 490 comprises: frame 452, screws 458, socket contacts 456, two locking levers 454a and 454b, independent detachable IC holder 480, spring loaded lid 402 and IC 406. FIG. 4A shows independent detachable IC holder 480 detached from spring loaded lid 402 and ready to be installed into spring loaded lid 402 (as shown by arrows). IC is shown loaded into the independent detachable IC holder 480. Spring loaded lid 402 is shown in the open position making an angle (between 45 and 115 degrees) with respect to socket contacts 456. In one example embodiment, when independent detachable IC holder 480 is slid into spring loaded lid 402, the edges of independent detachable IC holder 480 fit into channels in spring loaded lid. Independent detachable IC holder 480 may have features that snap into place and lock independent detachable IC holder 480 into spring loaded lid 402 when independent detachable IC holder 480 is fully installed.

Figure 4B:
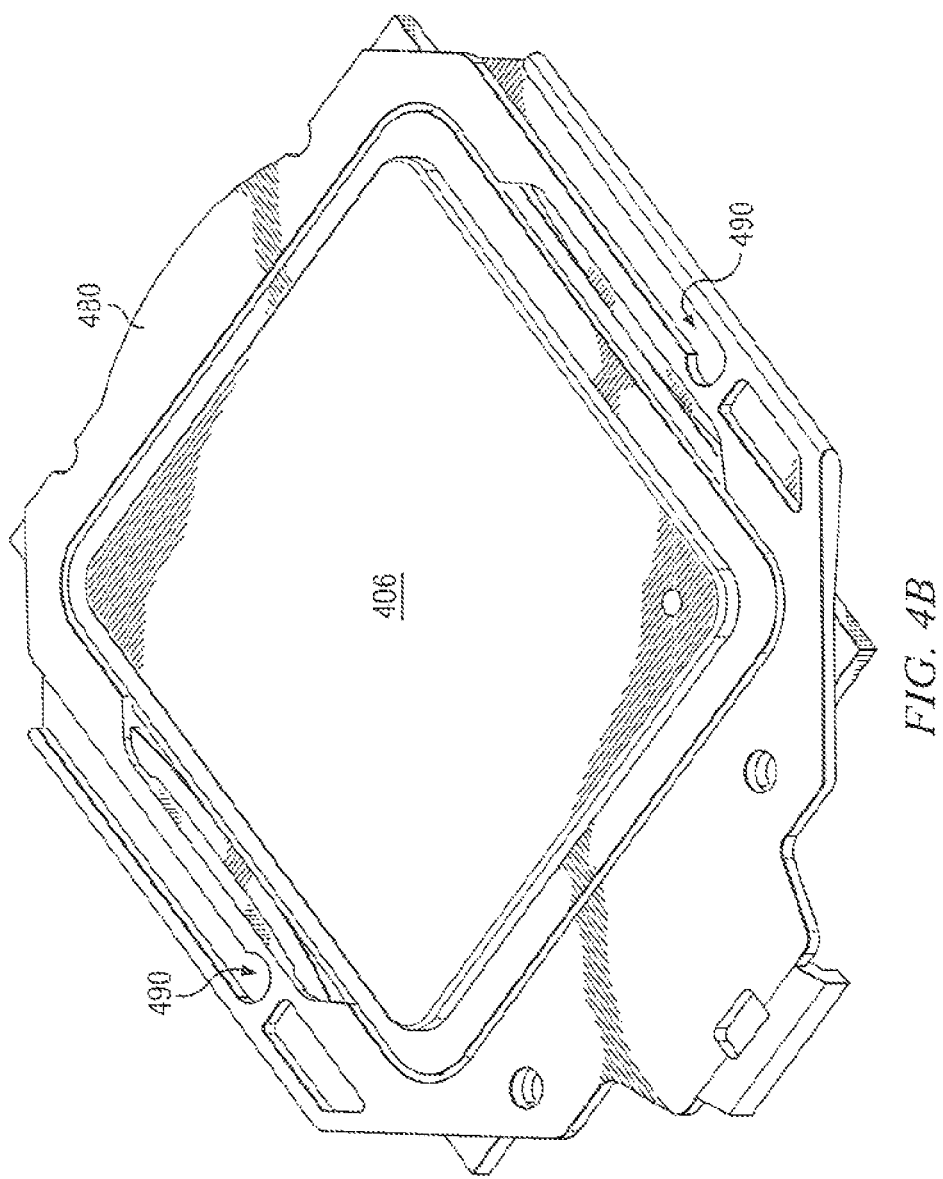
FIG. 4B is an isometric top view of independent detachable IC holder 480, in an example embodiment of the invention.
Figure 4C:
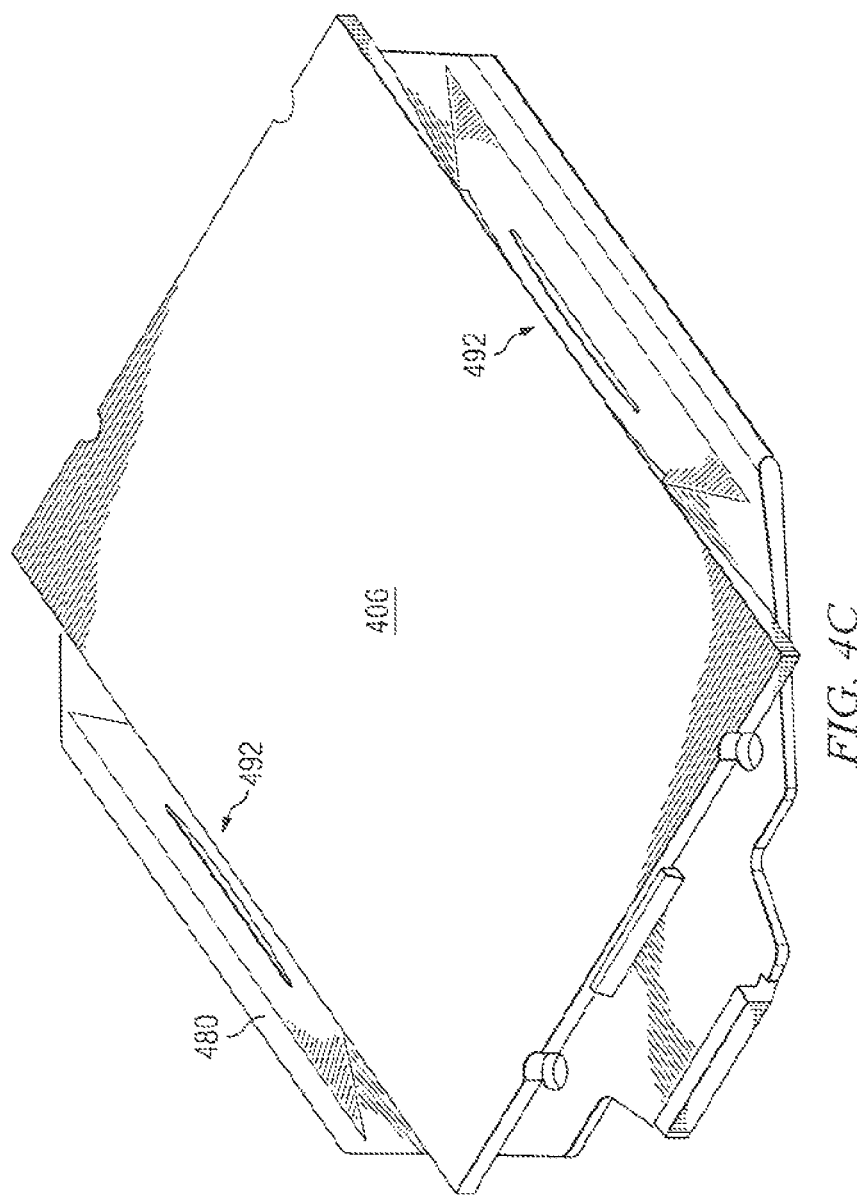
FIG. 4C is an isometric bottom view of independent detachable IC holder 480, in an example embodiment of the invention.

FIG. 4B is an isometric top view of independent detachable IC holder 480, in an example embodiment of the invention. FIG. 4C is an isometric bottom view of independent detachable IC holder 480, in an example embodiment of the invention. In FIG. 4B two slide in detents 490 can be seen formed into the two sides of the independent detachable IC holder 480. The two slide in detents interact with two pins 496 (one pin can be seen in FIG. 4A) formed in the two channels on spring loaded lid 402. The two slide in detents "snap" into place when the independent detachable IC holder 480 is fully inserted into spring loaded lid 402. Two friction stop features 492 are formed on the bottom side (see FIG. 4C) of independent detachable IC holder 480. The friction stop features interact with the two channels formed in spring loaded lid to hold the independent detachable IC holder 480 into the spring loaded lid.

In one example embodiment, IC 406 will be loaded into independent detachable IC holder before the IC is provided to a user. In another example embodiment, IC 406 will be loaded into independent detachable IC holder when IC is loaded into socket assembly 490. Independent detachable IC holder is formed to retain an IC inserted into the independent detachable IC holder. In one embodiment, independent detachable IC holder 280 may be fabricated from a flexible material and uses an interference fit to retain the IC. In another embodiment, the IC may snap into independent detachable IC bolder 280 and be retained by snap features in IC holder 280. In another example embodiment of the invention, IC may be held in place using glue or epoxy.

In some example embodiment of the invention, the spring loaded lid will be friction loaded such that the lid will be held in place at any angle between the open position and the closed position. In one example embodiment of the invention, the friction loading will be supplied by the interaction of the hinge pin against the pivot channel and the spring. The spring and the pivot channel remain stationary as the hinge pin rotates when the lid is rotated between the open position and the closed position. The spring pushes against the hinge pin creating friction between the hinge pin and the spring. The hinge pin is also forced against the top side of the pivot channel creating friction between the hinge pin and the pivot channel. The tolerance between the hinge pin and the spring and pivot channel, as well as the spring force of the spring, can be adjusted to hold the lid in place at any position between the open and closed position.

In another example embodiment of the invention, the friction loading may be supplemented by the interaction of the tabs 262 and the ends of the hinge pin 210. Tabs 262 may be bent slightly inward such that the distance between the tabs is smaller at the top of the pivot channel than at the bottom of the pivot channel. As hinge pin moves towards the top of the pivot channel the tabs 262 will act like springs holding the edges of lid 270 between them. The tolerance between the edges of lid 270 and the angle of the tabs 262, can be adjusted to help hold the lid in place at any position between the open and closed position.

What is claimed is:

1. An apparatus, comprising:
   a frame to be attached to a primary surface of a PC board;
   a first locking lever mounted in the frame and configured to be rotated between an open position and a closed, position wherein the first locking lever is mounted on one side of the frame:
   a lid, the lid having a hinge pin on one side of the lid;
   the frame having a pivot channel formed near the first locking lever wherein the hinge pin couples to the pivot channel and allows the lid to pivot between an open position and a closed position, the pivot channel having a length d between a top end and a bottom end of the pivot channel;
   at least one spring, the at least one spring acting to force the hinge pin towards the top end of the pivot channel;
   wherein the hinge pin is forced down towards the bottom end of the pivot channel when the lid is in the closed position and the first locking lever is moved from its open position into its closed position.

2. The apparatus of claim 1, wherein the hinge pin removably snaps into the pivot channel.

3. The apparatus of claim 1, wherein the lid further comprises:
   a spring loaded section, the spring loaded section having the hinge pin attached on a first side;
   a detachable section, the detachable section removably snapping into a second side of the spring loaded section, wherein the second side is opposite the hinge pin.

4. The apparatus of claim 1, wherein the lid further comprises:
   a first side channel and a second side channel, the second side channel opposite the first side channel, wherein the two side channels are parallel;
   an independent detachable IC holder, the independent detachable IC holder having two side edges, wherein the two side edges removably slidably fit into the first and second side channels in the lid.

5. The apparatus of claim 1, further comprising:
   a second locking lever mounted in the frame and configured to be rotated between an open position and a closed position, the second locking lever is mounted on the opposite side of the frame from the first locking lever, and wherein the lid has a tongue formed on the opposite side from the hinge pin and the second locking lever captures the tongue and forces the lid downwards when the lid is in the closed position and the second locking level is rotated from the open position to the closed position.

6. The apparatus of claim 1 wherein the lid further comprises:
   a bracket attached to the lid, the bracket having snap features that retain an IC when inserted into the bracket.

7. The apparatus of claim 1 wherein the at least one spring supplies a spring force between the frame and the hinge pin of between 1 lb and 3 lbs when the hinge pin is at the top of the top end of pivot channel and between 5 lbs and 10 lbs when the hinge pin is at the bottom end of the pivot channel.

8. The apparatus of claim 1 wherein the distance d is between 0.5 mm and 3.5 mm.

9. The apparatus of claim 1 wherein the pivot channel is formed by slots in two parallel tabs attached to the frame.

10. The apparatus of claim 1 wherein the hinge pin is cylindrical in shape.

11. The apparatus of claim 1 wherein the lid is friction loaded such that the lid will remain in position at any location between the open and closed positions.

12. An apparatus, comprising:
   a PC board;
   a frame attached to a primary surface of the PC board;
   a first locking lever mounted in the frame and configured to be rotated between an open position and a closed position wherein the first locking lever is mounted on one side of the frame;
   a lid, the lid having a hinge pin on one side of the lid;
   the frame having a pivot channel formed near the first locking lever wherein the hinge pm couples to the pivot channel and allows the lid to pivot between an open position and a closed position, the pivot channel having a length d between a top end and a bottom end of the pivot channel;
   at least one spring, the at least one spring acting against the frame and the hinge pin to force the hinge pin towards the top side of the pivot channel;
   wherein the hinge pin is forced down towards the bottom side of the pivot channel when the lid is in the closed position and the first locking lever is moved from its open position into its closed position;
   an IC loaded in the lid.

13. The apparatus of claim 12, wherein the hinge pin removably snaps into the pivot channel.

14. The apparatus of claim 12, wherein the lid further comprises:
   a first side channel and a second side channel, opposite the first side channel, wherein he two side channels are parallel;
   an independent detachable IC holder, the independent detachable IC holder having two side edges wherein the two side edges removably slidably fit into the first and second side channels in the lid and wherein the IC is loaded into the independent detachable IC holder.

15. A method for mounting a semiconductor into a socket, comprising:
   installing an IC into a lid;
   rotating the lid into a closed position;
   clamping the lid to a frame by rotating at least one locking level from an open position to a closed position, wherein the lid is forced down towards socket contacts against a spring when the first locking lever is moved from its open position into its closed position.

* * * * *

UNITED STATES PATENT AND TRADEMARK OFFICE
CERTIFICATE OF CORRECTION

| | | |
|---|---|---|
| PATENT NO. | : 9,192,070 B2 | Page 1 of 1 |
| APPLICATION NO. | : 13/984168 | |
| DATED | : November 17, 2015 | |
| INVENTOR(S) | : Chong S. Tan | |

It is certified that error appears in the above-identified patent and that said Letters Patent is hereby corrected as shown below:

IN THE CLAIMS

In column 6, line 14, in Claim 1, delete "closed," and insert -- closed --, therefor.

In column 6, line 16, in Claim 1, delete "frame:" and insert -- frame; --, therefor.

In column 6, line 45, in Claim 4, delete "edges," and insert -- edges --, therefor.

In column 7, line 20, in Claim 12, delete "pm" and insert -- pin --, therefor.

In column 8, line 11 approx., in Claim 14, delete "he" and insert -- the --, therefor.

Signed and Sealed this
Fifth Day of April, 2016

Michelle K. Lee
*Director of the United States Patent and Trademark Office*